United States Patent
Sadowski (10) Patent No.: US 9,419,782 B1
(45) Date of Patent: Aug. 16, 2016

(54) EFFICIENT ASYNCHRONOUS COMMUNICATION PROTOCOL

(71) Applicant: Advanced Micro Devices, Inc., Sunnyvale, CA (US)

(72) Inventor: Greg Sadowski, Cambridge, MA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 0 days.

(21) Appl. No.: 14/639,813

(22) Filed: Mar. 5, 2015

(51) Int. Cl.
*H04L 7/00* (2006.01)
*H04L 12/26* (2006.01)
*H04L 1/18* (2006.01)

(52) U.S. Cl.
CPC ............ *H04L 7/0041* (2013.01); *H04L 1/1858* (2013.01); *H04L 43/0888* (2013.01)

(58) Field of Classification Search
CPC ..... G06F 2207/3864; G06F 5/08; G06F 7/00; G06F 9/3869; H04L 7/0041; H04L 42/0888; H04L 1/1858
USPC .......................... 375/224, 225, 295, 316, 354
See application file for complete search history.

(56) References Cited

U.S. PATENT DOCUMENTS

| | | | | |
|---|---|---|---|---|
| 5,465,346 A * | 11/1995 | Parks | ..................... | H03K 5/135 710/116 |
| 5,918,042 A * | 6/1999 | Furber | .................. | G06F 9/3871 708/233 |
| 2001/0056552 A1* | 12/2001 | Cook | ..................... | G06F 9/3869 713/500 |
| 2010/0322365 A1* | 12/2010 | Dobkin | ..................... | H04L 7/00 375/354 |
| 2011/0121857 A1* | 5/2011 | Nowick | ............... | H03K 19/173 326/54 |
| 2014/0247069 A1* | 9/2014 | Gill | ...................... | H03K 19/177 326/39 |

\* cited by examiner

*Primary Examiner* — Freshteh N Aghdam
(74) *Attorney, Agent, or Firm* — Abel Law Group, LLP (57) ABSTRACT

A more efficient asynchronous protocol transmits data from a transmitter circuit at a first time to a receiver circuit and transmits a next data from the transmitter circuit to the receiver circuit at a second time so that the next data arrives at the receiver circuit at approximately the same time an acknowledge signal of the first data from the receiver circuit arrives at the transmitting circuit. The propagation delay may be measured at the beginning of a transfer to help determine when to send data.

23 Claims, 8 Drawing Sheets

Fig. 1

(Prior Art)

Fig. 2

(Prior Art)

EFFICIENT ASYNCHRONOUS COMMUNICATION PROTOCOL

BACKGROUND

1. Field of the Invention

This disclosure relates to data communications and more particularly to efficient communication between transmitters and receivers.

2. Description of the Related Art

Figure 1:
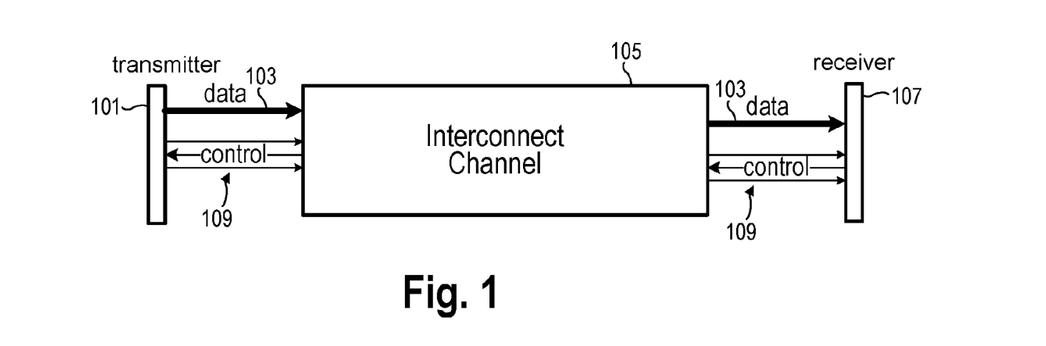
FIG. 1 illustrates a basic interconnect structure.

It is often necessary to move data over on-chip-interconnects, on interposer between dies, or other interconnect channels. Data movement performance is expressed in bandwidth and latency of the combined transmitter, interconnect-channel and receiver. FIG. 1 illustrates a basic interconnect structure with a transmitter 101 transmitting data 103 over the interconnect channel 105 to a receiver 107. Control information 109 controls the movement of data over the interconnect channel between the transmitter and receiver.

Figure 2:
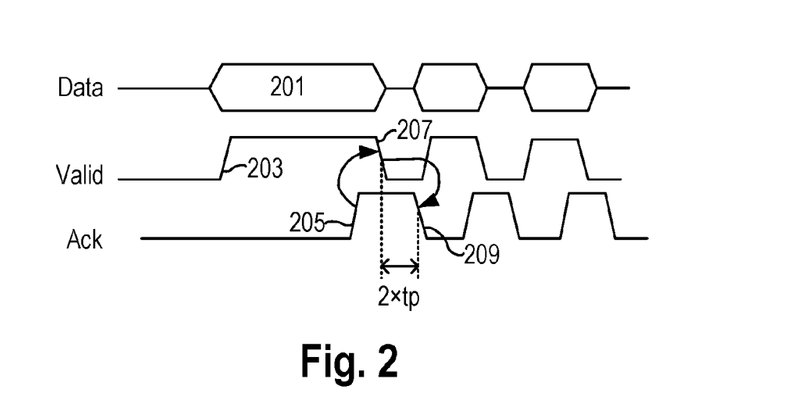
FIG. 2 illustrates asynchronous handshake principles.

FIG. 2 illustrates asynchronous handshake principles that may be used to communicate over the interconnect of FIG. 1. For the transmitter to receiver handshake, when transmitter has a new data ready, the transmitter drives data 201 and asserts the Valid signal 203. When the receive side receives the data, the receive side asserts the acknowledge (Ack) signal, which is seen at the transmitter at 205. When the transmitter sees the asserted Ack signal, the transmitter deasserts Valid at 207. When the receiver sees the deasserted Valid signal, the receiver deasserts the Ack signal, which is seen by the transmitter at 209. As can be seen in FIG. 2, propagation delay resulting from the handshake can consume a significant amount of time.

SUMMARY OF EMBODIMENTS OF THE INVENTION

Various embodiments achieve a more efficient asynchronous protocol. In one embodiment a method includes transmitting first data from a transmitter circuit at a first time to a receiver circuit and transmitting a next data from the transmitter circuit to the receiver circuit at a second time so that the next data arrives at the receiver circuit at approximately the same time an acknowledge signal of the first data from the receiver circuit arrives at the transmitting circuit.

In another embodiment an apparatus includes a transmitter circuit responsive to transmit data on each edge of a valid signal, the transmitter circuit responsive to transmit first data at a first time corresponding to a first edge of a valid signal to a receiver circuit. The transmitter circuit is further configured to transmit a next data from the transmitter circuit to the receiver circuit at a second time so that the next data arrives at the receiver circuit at approximately the same time an acknowledge signal of the first data from the receiver circuit arrives at the transmitting circuit.

In another embodiment a method includes sending data from a transmitter to a receiver and measuring an amount of time it takes to receive an acknowledge signal from the receiver. Additional data is sent from the transmitter to the receiver at a time based on the measured amount of time.

BRIEF DESCRIPTION OF THE DRAWINGS

The present invention may be better understood, and its numerous objects, features, and advantages made apparent to those skilled in the art by referencing the accompanying drawings.

The use of the same reference symbols in different drawings indicates similar or identical items.

DETAILED DESCRIPTION

The propagation time of the Ack signal impacts achieving high throughput when using an asynchronous handshaking protocol. As can be seen in FIG. 2, the propagation delay between assertion of the Valid signal by the transmitter and receipt of the deasserted Ack signal is twice the propagation delay ($2 \times tp$) of the channel (plus processing time for deassertion). One way to achieve high throughput would be to use a faster interconnect for the Ack signal—otherwise the maximum bandwidth is approximately half of the maximum propagation velocity. The Ack signal guarantees asynchronous behavior of the interconnect under any condition but use of the Ack signal in the manner shown in FIG. 3 impacts throughput. Accordingly, as described further herein, embodiments use an asynchronous handshake approach in which data is transmitted on each edge of the Valid signal and transmission of data does not wait for the Ack signal to reduce the impact of propagation delay.

Figure 3:
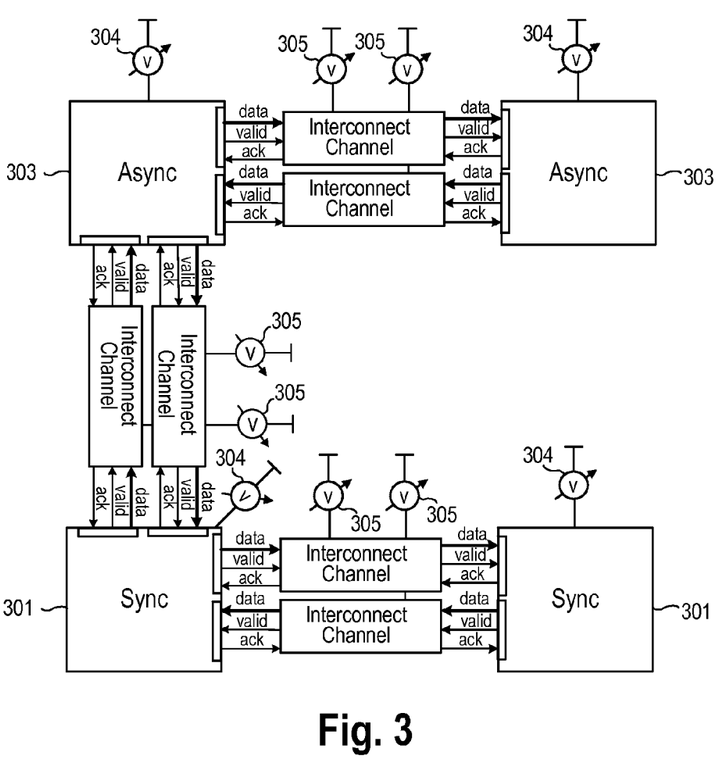
FIG. 3 illustrates a system having synchronous cores, asynchronous cores, and various interconnects between them.

The two ends of the interconnect frequently interface to different environments in terms of operating voltages, clock frequencies, and types of timing control, e.g., clockless. FIG. 3 illustrates a system having synchronous cores 301 and asynchronous cores 303. The cores may have dynamically adjustable voltage supplies 304. The synchronous cores may run dynamically adjustable clock frequencies. Any communication channel interconnect may have a variable voltage supply 305. An interconnect with asynchronous handshake control is a general solution to such a system. A voltage level shifter circuit allows for a wide range of voltage differences. FIG. 3 illustrates four types of interfaces: Asynchronous-transmitter; Asynchronous-receiver; Synchronous-transmitter; Synchronous-receiver.

Figure 4:
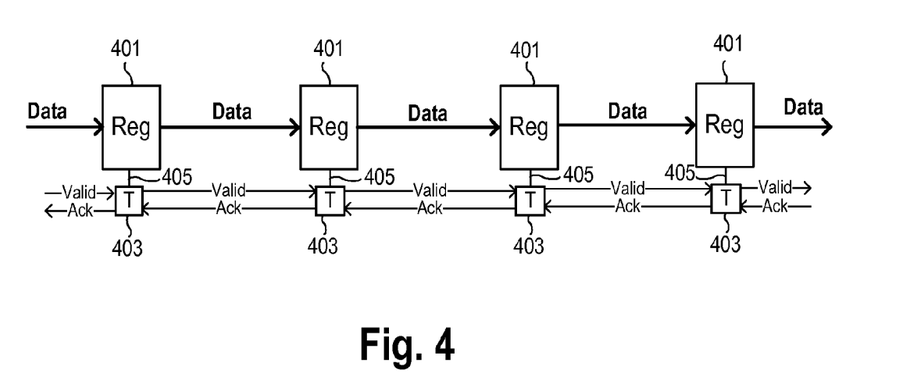
FIG. 4 illustrates an example of an interconnect.
Figure 5:
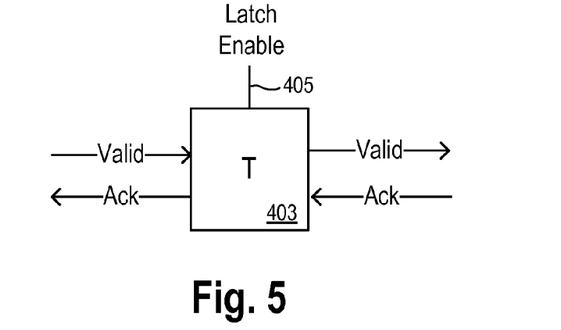
FIG. 5 shows a transmission element in isolation.
Figure 6:
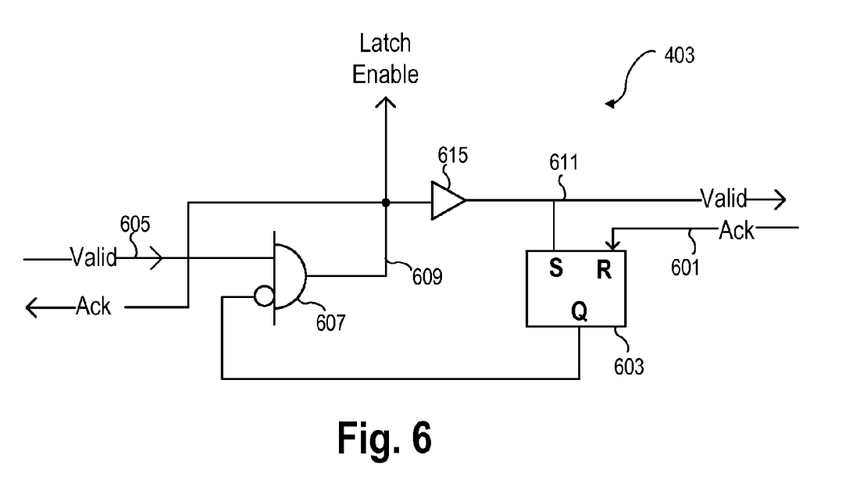
FIG. 6 illustrates additional details of an embodiment of a transmission element.

A variety of interconnects can be used between transmitter and receiver depending on the particular system. FIG. 4 illustrates an example of an interconnect in which signal edges are generally not used to carry info, and latches 401 can be used as re-timing registers. The transmission elements (T) 403 function as the handshake circuit. The Ack mechanism converts the interconnect registers into a FIFO. FIG. 5 shows the transmission element 403 in isolation that provides the latch enable signal 405. FIG. 6 illustrates additional details of the transmission element 403. Assertion of the incoming Ack Signal 601 causes the SR latch 603 to reset. When the valid signal 605 asserts, AND gate 607 asserts the latch enable signal 609 (assuming Q is 0), which also drives the outgoing Ack signal and the outgoing Valid signal. When the outgoing valid signal is asserted, it sets SR latch 603 causing Valid 611 to fall. The length of the asserted valid signal 611 is determined by the delay of S-to-Q of SR latch 603, the delay of the AND gate 607, and the delay through buffer 615.

Figure 7:
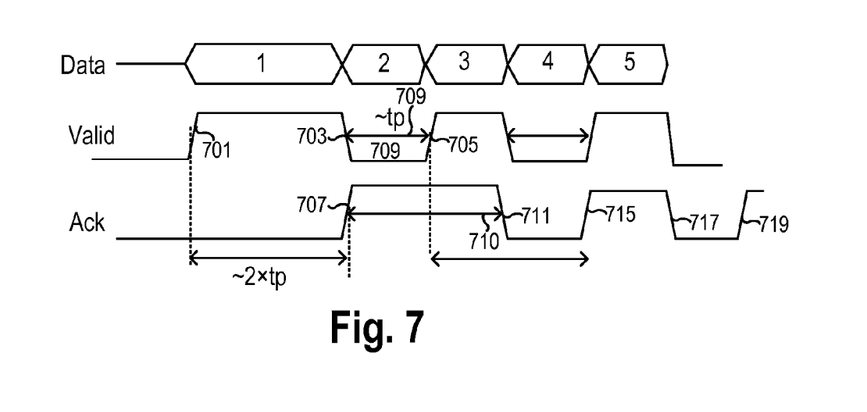
FIG. 7 illustrates a more efficient approach to asynchronous handshake protocols according to an embodiment.

Rather than use the asynchronous handshake approach of FIG. 2, FIG. 7 illustrates an improved approach to asynchronous handshake protocols that improves throughput and can be used, e.g., in the various interconnects shown in FIG. 3. A system operating in accordance with FIG. 7 achieves close to the maximum possible propagation bandwidth. For the transmitter to receiver handshake, the transmitter sends data on each transition 701, 703, 705, etc., of the Valid signal. Thus, using signal edges, the transmitter sends Data on both rising and falling edges of Valid. Note that each of the data elements Data1 (initial data), Data2, Data3, etc., may be multiple bits or bytes of data. The number of data elements in any particular data transfer will vary according the particular protocol being utilized. The propagation time for the transmitter-receiver loop is approximately 2×tp, where tp represents the one way propagation time from the transmitter to the receiver (or the receiver to the transmitter). Rather than wait for the Ack signal to arrive, resulting in data being sent every 2tp, the embodiment shown in FIG. 7 utilizes half of that time (approximately tp) to send each Data on each edge of the Valid signal. Note that in the embodiment shown in FIG. 7, the Ack signal acknowledging the arrival of Data1 at the receiver arrives at the transmitter at 707 before Data2 is sent by the transmitter. That allows time to measure the propagation delay so Data1 takes longer than the other data in the transfer shown in FIG. 7. After receipt of the first Ack edge at 707, the transmitter transmits Data2, Data3, Data4, and Data5 in approximately the time interval tp 709. After the first Ack signal, having an asserted portion 710 that lasts approximately 2×tp, the Ack signal uses each edge as an acknowledgement. In particular, edge 711 acknowledges receipt of Data2, edge 715 acknowledges the receipt of Data3, edge 717 acknowledges receipt of Data 4, and edge 719 acknowledges receipt of Data 5. As can be seen, the Ack signal resembles the Valid signal delayed by 2tp. As used herein "approximately" means within, e.g., 10% or less of the time interval being compared. If two propagation delays are substantially equal, they are within 10% of each other. In another example, if a signal arrives at the receiver at approximately the same time another signal arrives at the transmitter, the signal arrives at the receiver at a time that differs from the transmitter arrival time 10% or less of the propagation delay.

Figure 8:
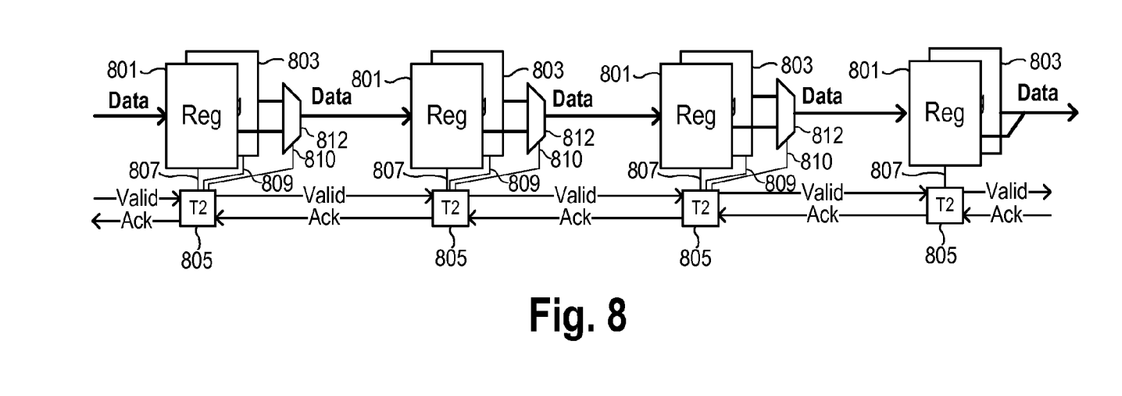
FIG. 8 shows an interconnect with two latches that may be used with approach of FIG. 7.
Figure 9:
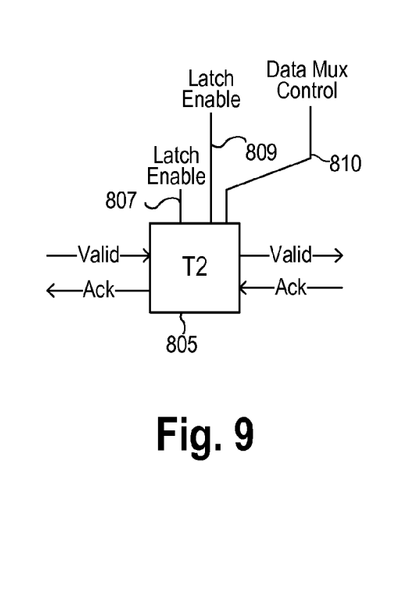
FIG. 9 shows the transmission element controlling two latches in isolation.

If there is a guarantee that transmission channel is always ready, then the T element 403 can be utilized and the interconnect channel shown in FIG. 4 can be utilized with the asynchronous handshake approach of FIG. 7. In the general case though, the re-timer needs two registers (two latches) as shown in FIG. 8. One register 801 stores data valid on the rising edge of the Valid signal, and one register 803 stores data valid on the falling edge of Valid. FIG. 9 shows the T2 element in isolation. The T2 element is similar to T element 403, but double the circuit. The T2 element supplies two latch enables 807 and 809. In addition the T2 element supplies a control signal to multiplexor circuit 812 to select data from registers 801 or 803.

Figure 10:
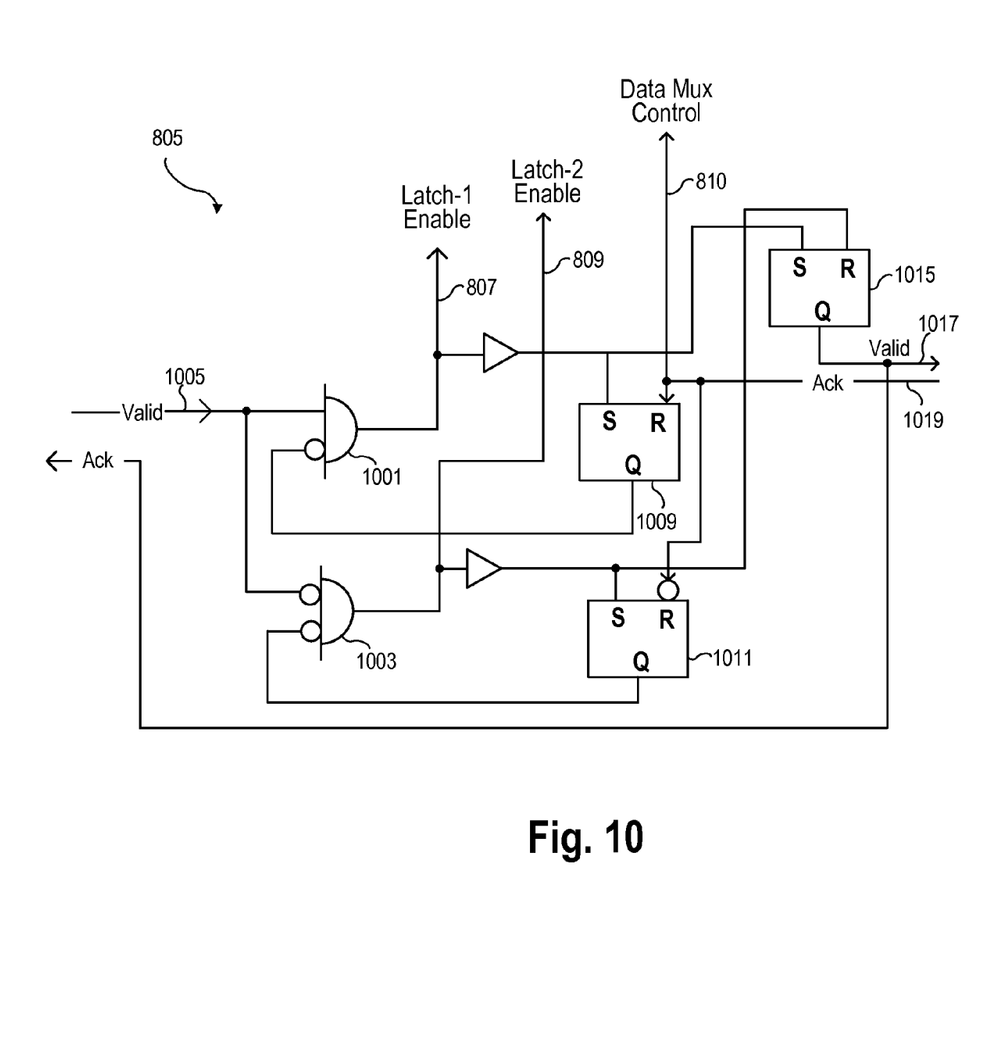
FIG. 10 illustrates additional details of an embodiment of a transmission element.

FIG. 10 illustrates a T2 element 805 supplying latch enables 807 and 809. AND gates 1001 and 1003 receive the Valid signal 1005 and supply respectively latch enable 807 and latch enable 809. The value of the latch enables are also determined by SR latches 1009 and 1011. SR latch 1015 supplies the Valid signal 1017. The polarity of the Valid signal 1017 is determined by the latch enable signals. Ack signal 1019 determines the value of the data multiplexer control signal 810.

Figure 11:
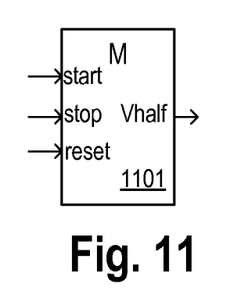
FIG. 11 illustrates a measuring element to measure propagation delay.
Figure 12:
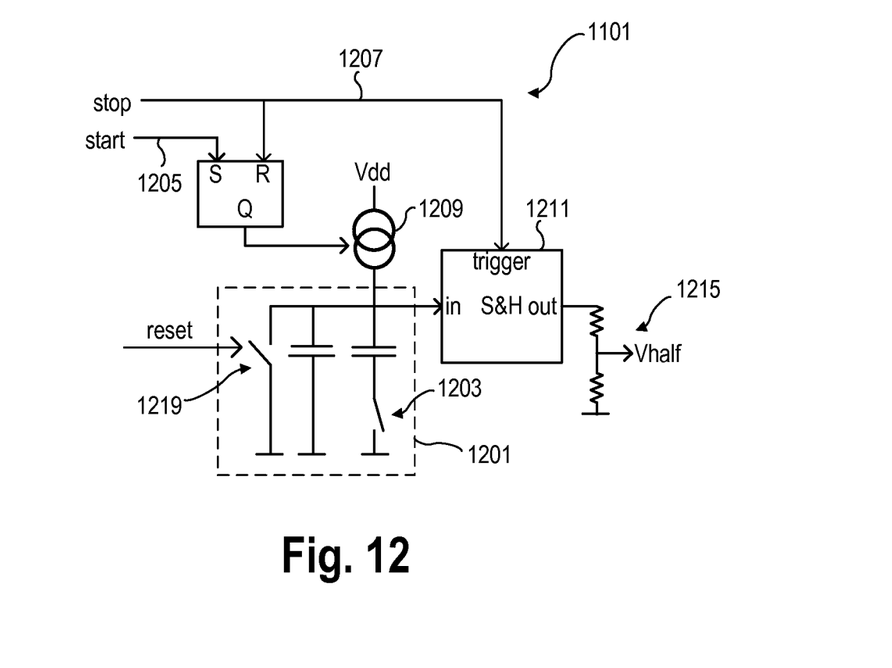
FIG. 12 illustrates additional details of an embodiment of a measuring element.

Measuring propagation time (actually double propagation time) in order to know how fast data can be transmitted presents a challenge. In one embodiment, illustrated in FIG. 11, a measuring element M 1101 generates half of the measured time. FIG. 12 illustrates one embodiment for implementing a measuring element M 1101. A charging capacitor circuit 1201 converts the propagation time interval to a voltage level. To cover a variable timing range, a variable number of switchable capacitors can be used. Thus, switch 1203 can be used to switch in additional capacitance. The capacitors start charging with assertion of start pulse 1205 and charge until assertion of stop pulse 1207. The stop and start signals may be generated by edge detector circuits from Valid and Ack signals as shown in more detail in FIG. 15. A current source 1209 supplies charging current and is used so the voltage increases linearly with time. A voltage source can be used in other embodiments, but the "half time" voltage would be at ~$e^{-0.5}$ and not at 0.5 and thus more complex half voltage circuitry may be required. A "sample and hold" circuit 1211 captures the voltage level corresponding to given propagation time interval and is triggered by the stop signal 1207. Voltage divider 1215 divides the voltage from the sample and hold circuit and supplies a voltage (Vhalf) that is half of the sample and hold voltage. The reset signal can be used to close the switch 1219 and clear the capacitors for the next measurement.

Figure 13:
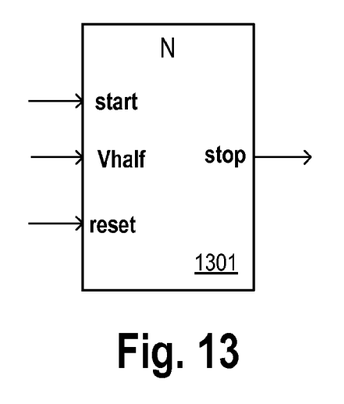
FIG. 13 illustrates a measuring element to control duration of a Valid pulse.
Figure 14:
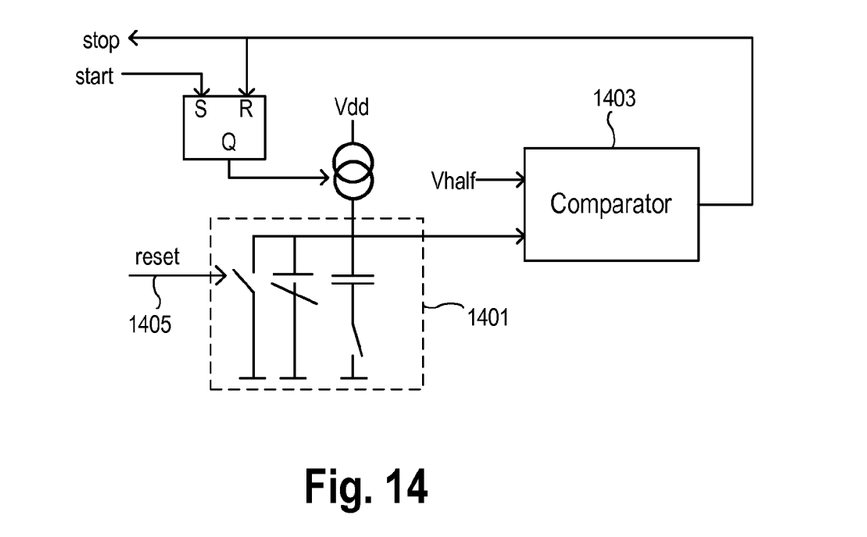
FIG. 14 illustrates additional details of an embodiment of the measuring element to control duration of a Valid pulse.

Referring to FIG. 13, an N element 1301 is used in conjunction with circuit M 1101 to determine the duration of the Valid pulse. FIG. 14 illustrates additional detail of an embodiment of the N element 1301. A charging capacitor circuit 1401 converts voltage to duration of a pulse. Identical capacitors (i.e. closely matched) should be used in the N element and in the "measurement" circuit (M element), thus requiring appropriate care in design and calibration. The capacitance in circuit 1401 charges beginning with the start pulse until the voltage reaches the same voltage level as Vhalf. A comparator 1403 compares Vhalf and the voltage on the capacitors and when the compare circuit determines the voltages are equal, triggers the stop signal. For example, the start signal is generated from falling edge of the Valid signal, and stop causes the Valid signal (and new Data) to be asserted high again. The reset signal 1405 can be used to close the switch and clear the capacitors for the next measurement.

While embodiments can measure the round trip propagation delay as illustrated in FIG. 12, other embodiments rely on other approaches to determining the propagation delay. For example, the propagation delay may be determined based on a power state of the various components attached to the interconnect channel. In such embodiments, a lookup table may be used to provide a digital value of the propagation delay based on the power state. In still other embodiments, training can be performed in various power states to determine propagation delay based on power states with the determined propagation delays stored in a lookup table. A digital to analog converter may be used to convert the digital value from the look up table to a voltage value that can be used as Vhalf and supplied to the N element 1301. In other embodiments, if a sufficiently fast clock is available to provide an appropriate measurement accuracy, the round trip time can be determined in a counter and the M and N elements can both be implemented digitally.

Figure 15:
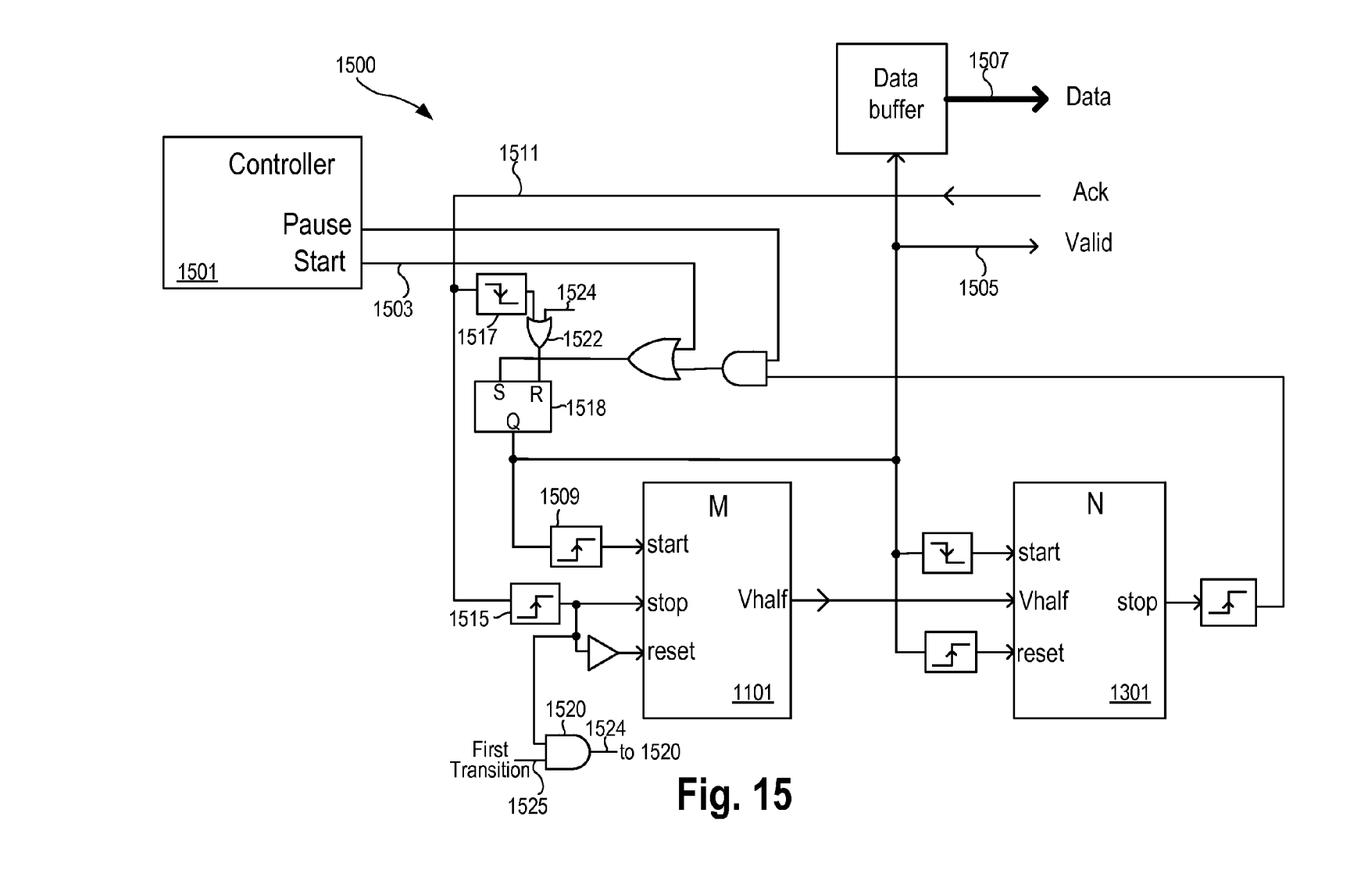
FIG. 15 illustrates an example of a transmitter.

FIG. 15 illustrates an example of a transmitter 1500 that may be used in various embodiments. Control logic 1501 may be implemented, e.g., has a state machine, implemented in digital logic, programmable logic such as a microcontroller operating under software control stored on computer readable media, or any appropriate combination of hardware and software to implement the described functionality. Transmitter 1500 includes control logic 1501, measuring M element 1101 and N element 1301 to control the duration of Valid. Assertion of the Start signal 1503 by the Controller 1501, causes the Valid signal 1505 to assert and Data1 (see FIG. 7) to be supplied on Data 1507 with the Valid signal. Edge detector circuit 1509 detects the rising edge of the Valid signal 1505, which results in assertion of the start signal supplied to M element 1101. Responsive to the start signal, the M element begins measuring the duration of the round trip propagation delay. Responsive to the rising edge of the Ack signal 1511, edge detect circuit 1515 causes the measurement to stop and resets the capacitors so they are ready for the next measurement. The M circuit has now measured the round trip propagation delay, which can be used to control the switching of Valid. As the environmental conditions change, the measurement may be periodically repeated, but the measurement can be performed at some lower frequency, e.g., once a millisecond, or once a second (depending on dynamics of the environment). Thus, transfers may occur in some embodiments in which the round trip propagation delay is based on an earlier measurement.

Transition detector 1515 supplies the indication of the rising edge of Ack to AND gate 1520, which in turn supplies the AND gate output signal 1524 to OR gate 1522. When the output of OR gate 1522 is high, SR latch 1518 resets, which in turn causes Valid to transition from high to low. Note that the AND gate 1520 is enabled by the "First Transition" signal 1525, which indicates that this is the first transition of the Ack signal. After that the control path through AND gate 1520 is turned off as it is not needed to cause a transition on Valid. The negative going transition on the Valid signal results in the next Data (Data1) being supplied on 1507. In addition the negative going transition on the Valid signal results in the timer circuit N starting to time the duration of the valid pulse. When the voltages Vhalf and the charging voltage are equal, stop is asserted by N element 1301, which sets the SR latch 1518 causing Valid to transition from low to high. The transition from low to high on Valid results in Data3 being sent and resets the interval measurement circuit (N element 1301). The Ack signal 1507 transitioning from high to low, resets the latch 1518 resulting in the N element again starting measurement of the Valid interval. Thus, the falling edge of the Ack signal triggers the falling edge of the Valid signal and the propagation timer (N element 1301) triggers the rising edge of the Valid signal a time tp after the falling edge of Valid. Note that the receiver follows the Valid signal edges and thus latches data on the rising and falling edges of the Valid signal and sends out the Ack in response to the Valid signal transition.

While circuits and physical structures have been generally presumed in describing embodiments of the invention, it is well recognized that in modern semiconductor design and fabrication, physical structures and circuits may be embodied in a computer readable medium as data structures for use in subsequent design, simulation, test, or fabrication stages. For example, such data structures may encode a functional description of circuits or systems of circuits. The functionally descriptive data structures may be, e.g., encoded in a register transfer language (RTL), a hardware description language (HDL), in Verilog, or some other language used for design, simulation, and/or test. Data structures corresponding to embodiments described herein may also be encoded in, e.g., Graphic Database System II (GDSII) data, and functionally describe integrated circuit layout and/or information for photomask generation used to manufacture the integrated circuits. Other data structures, containing functionally descriptive aspects of embodiments described herein, may be used for one or more steps of the manufacturing process.

Computer-readable media include tangible computer readable media, e.g., a disk, tape, or other magnetic, optical, or electronic storage medium. In addition to computer-readable medium having encodings thereon of circuits, systems, and methods, the computer readable media may store instructions as well as data that can be used to implement embodiments described herein or portions thereof. The data structures may be utilized by software executing on one or more processors, firmware executing on hardware, or by a combination of software, firmware, and hardware, as part of the design, simulation, test, or fabrication stages.

The description of the embodiment set forth herein is illustrative, and is not intended to limit the scope of the invention as set forth in the following claims. Other variations and modifications of the embodiments disclosed herein may be made based on the description set forth herein, without departing from the scope of the invention as set forth in the following claims.

What is claimed is:

1. A method comprising:
   transmitting first data from a transmitter circuit at a first time to a receiver circuit; and
   transmitting a next data from the transmitter circuit to the receiver circuit at a second time so that the next data arrives at the receiver circuit at approximately a same time an acknowledge signal of the first data from the receiver circuit arrives at the transmitter circuit,
   wherein approximately the same time means a difference between a third time at which the next data arrives at the receiver circuit and a fourth time at which the acknowledge signal arrives at the transmitter circuit is ten percent or less of a propagation delay between the transmitter circuit and the receiver circuit.

2. The method as recited in claim 1 further comprising:
   sending data on each edge of a valid signal; and
   sending an acknowledge on each edge of the acknowledge signal.

3. The method as recited in claim 1 wherein an initial data is sent, the first data is sent according to a receipt of an initial acknowledge signal transition, and the next data is sent according to a determined time interval corresponding to half of a time interval between assertion of an initial valid signal transmitted with the initial data and receipt of the initial acknowledge signal transition at the transmitter circuit sent by the receiver circuit indicating receipt of the initial data by the receiver circuit.

4. The method as recited in claim 3 wherein the determined time interval is determined at least in part according to a power state.

5. The method as recited in claim 3 wherein the determined time interval is measured at a beginning of a transfer across an interconnect.

6. The method as recited in claim 3 wherein the initial data is sent according to a start signal.

7. The method as recited in claim 3 further comprising:
determining the second time according to a length of time for the initial data to travel from the transmitter circuit to the receiver circuit.

8. The method, as recited in claim 7 wherein determining how long it takes for data to travel from the transmitter circuit to the receiver circuit comprises:
determining a time interval between assertion of the initial valid signal transmitted with the initial data and receipt of the initial acknowledge signal transition at the transmitter circuit sent by the receiver circuit indicating receipt of the initial data by the receiver circuit;
dividing the time interval in half to obtain a second time interval corresponding to how long it takes for data to travel from the transmitter circuit to the receiver circuit; and
using the second time interval to determine the second time.

9. The method, as recited in claim 8 further comprising:
charging a capacitance responsive to assertion of the initial valid signal and stopping charging the capacitance responsive to assertion of the initial acknowledge signal transition;
sampling a voltage on the capacitance in a sample and hold circuit; and
dividing the sampled voltage supplied by the sample and hold circuit using a voltage divider to generate a voltage corresponding to the second time interval.

10. The method, as recited in claim 8 further comprising:
sending the next data responsive to an end of the second time interval.

11. The method, as recited in claim 9 further comprising:
comparing a voltage on a second capacitance to the voltage corresponding to the second time interval to measure the second interval.

12. The method, as recited in claim 8 further comprising:
periodically determining the time interval.

13. An apparatus comprising:
a transmitter circuit configured to transmit data on each edge of a valid signal, the transmitter circuit responsive to transmit first data at a first time corresponding to a first edge of the valid signal to a receiver circuit; and
wherein the transmitter circuit is further configured to transmit a next data from the transmitter circuit to the receiver circuit at a second time so that the next data arrives at the receiver circuit at approximately a same time an acknowledge signal of the first data from the receiver circuit arrives at the transmitter circuit,
wherein approximately the same time means a difference between a third time at which the next data arrives at the receiver circuit and a fourth time at which the acknowledge signal arrives at the transmitter circuit is ten percent or less of a propagation delay between the transmitter circuit and the receiver circuit.

14. The apparatus as recited in claim 13 further comprising:
the receiver circuit configured to send an acknowledge on each edge of the acknowledge signal; and
wherein the transmitter circuit is configured to use each edge of the valid signal to indicate new data.

15. The apparatus as recited in claim 13 wherein the transmitter circuit is configured to transmit initial data, to transmit the first data responsive to a receipt of an initial acknowledge signal edge, and to transmit the next data according to a determined time interval corresponding to half of a time interval between assertion of an initial valid signal transmitted with the initial data and receipt of the initial acknowledge signal edge at the transmitter circuit sent by the receiver circuit indicating receipt of the initial data by the receiver circuit.

16. The apparatus as recited in claim 15 where the determined time interval is determined at least in part according to a power state.

17. The apparatus as recited in claim 15 wherein additional data following the next data is sent according to the determined time interval.

18. The apparatus as recited in claim 15 further comprising a measurement circuit to measure the determined time interval.

19. The apparatus as recited in claim 15 wherein the transmitter circuit is configured to send the initial data responsive to a start signal.

20. The apparatus, as recited in claim 18 wherein the measurement circuit further comprises:
a capacitance circuit responsive to assertion of the initial valid signal to start charging a capacitance in the capacitance circuit and to stop charging the capacitance responsive to the initial acknowledge signal edge;
a sample and hold circuit coupled to the capacitance circuit to store voltage on the capacitance;
a voltage divider coupled to the sample and hold circuit to divide voltage on the capacitance circuit to generate a divided voltage corresponding to a second time interval, the second time interval corresponding to the determined time interval.

21. The apparatus as recited in claim 20 wherein the transmitter is configured to send the next data responsive to an end of the second time interval.

22. The apparatus as recited in claim 21 further comprising:
a second capacitance circuit;
a comparator to compare a voltage on the second capacitance circuit to the divided voltage and to provide an indication when the second time interval has been reached.

23. The apparatus as recited in claim 13 further comprising:
a transmission element with two latches or registers and the transmission element supplies two latch enables, one at a rising edge of the valid signal and one at a falling edge of the valid signal.

* * * * *